United States Patent [19]

Kikuchi

[11] Patent Number: 5,420,547
[45] Date of Patent: May 30, 1995

[54] RING OSCILLATOR HAVING BANDPASS FILTERS BETWEEN STAGES

[75] Inventor: Hidekazu Kikuchi, Kanagawa, Japan

[73] Assignee: Sony Corporation, Japan

[21] Appl. No.: 262,020

[22] Filed: Jun. 17, 1994

[30] Foreign Application Priority Data

Jun. 30, 1993 [JP] Japan .................. 5-162938

[51] Int. Cl.⁶ .................. H03B 5/02; H03K 3/282
[52] U.S. Cl. .................. 331/57; 331/135; 331/177 R
[58] Field of Search ............ 331/57, 111, 135, 177 R

[56] References Cited

U.S. PATENT DOCUMENTS 4,337,529  6/1982  Morokawa .................. 331/47 X
5,191,301  3/1993  Mullgrav, Jr. .................. 331/57
5,315,547  5/1994  Shoji et al. .................. 365/185

Primary Examiner—Siegfried H. Grimm
Attorney, Agent, or Firm—Ronald P. Kananen

[57] ABSTRACT

A ring oscillator giving oscillation with a high, stable Q value. The ring oscillator is constituted by gain-stages connected by lowpass filters consisting of a resistance element and a capacitive element connected in series and is provided with transconductance circuits including transistors parallel to the capacitive elements of the lowpass filters. By passing currents proportional to signal voltages differing $\theta$ in phase, it is possible to operate the low pass filters as bandpass filters. By this, oscillation with a high, stable Q value is obtained. The ring oscillator can be modified to a voltage controlled oscillator by using variable current sources.

14 Claims, 8 Drawing Sheets

RING OSCILLATOR HAVING BANDPASS FILTERS BETWEEN STAGES

BACKGROUND OF THE INVENTION

1. Field of the Invention

The present invention relates to a ring oscillator and a voltage controlled oscillator (VCO) able to be used for example in a phase locked loop (PLL) for high speed optical communications.

2. Description of the Related Art

There is known in the related art a ring oscillator which does not use any vibration element such as a quartz oscillator, but is comprised of an odd number of inverters $IV_1$ to $IV_n$ connected as a ring, as shown in FIG. 1.

In such a configuration, by inputting control signals $CTL_1$ to $CTL_n$ to the inverters $IV_1$ to $IV_n$ from the outside, the propagation delay times of the inverters $IV_1$ to $IV_n$ can be controlled and the frequencies of the output signals of the inverters $IV_1$ to $IV_n$ can be adjusted.

In such a ring oscillator of the related art, however, the Q value is low, it is difficult to realize a duty of 50 percent, and there is jitter. Namely, it is not possible to obtain stable oscillation.

SUMMARY OF THE INVENTION

An object of the invention is to provide a ring oscillator giving oscillation with a high and improved Q value.

Another object of the present invention is to provide a voltage controlled oscillator (VCO) giving a high frequency oscillation signal.

According to the present invention, there is provided a ring oscillator including a plurality of gain-stages;

a plurality of resistance elements each of which is connected between the adjoining gain-stages;

a plurality of capacitive elements each of which is connected between the inputs of the gain-stage and a reference potential, the resistance element and the capacitive element forming a lowpass filter; and a plurality of transconductance circuits connected between the inputs of the gain-stage and the reference potential.

The lowpass filter and the transconductance circuit function as a bandpass filter.

The transconductance circuit passes a current with a fixed phase different from the input of the gain-stage from the input to the reference potential.

The voltage input terminal of the transconductance circuit of one gain-stage receives voltage from the input voltage of another gain-stage in the ring. The input voltage of the other gain-stage and the output voltage of the one gain-stage have a fixed phase difference.

Preferably, each of the gain-stages includes an inverter, there are an odd number A of the inverters in total, and an output of the last stage inverter is connected to an input of the first stage inverter through the resistance element in the bandpass filter.

Also, preferably, each of the gain-stages includes a number of differential type gain-stages, and there are an even number of the gain-stages in total. Two bandpass filters are provided in parallel between one gain-stage and a next gain-stage: a first bandpass filter comprising a first lowpass filter including a first resistance element, a first capacitive element, and a first transconductance circuit including a transistor and a second bandpass filter comprising a second lowpass filter including a second resistance element, a second capacitive element, and a second transconductance circuit including a transistor. A positive output terminal of the last gain-stage is connected to a negative input terminal of the first gain-stage through the first resistance element, and a negative output terminal of the last gain-stage is connected to a positive input terminal of the first gain-stage through the second resistance element.

Also, according to the present invention, there is provided a voltage controlled circuit (VCO) including the ring oscillator and a plurality of variable current sources, each connected to emitters of the transistors of the transconductance circuit and including a transistor with a base to which is applied a control voltage.

BRIEF DESCRIPTION OF THE DRAWINGS

The above and other objects and features of the present invention will be more apparent from the following description of the preferred embodiments with reference to the accompanying drawings, wherein.

DESCRIPTION OF THE PREFERRED EMBODIMENTS

Embodiments of the present invention will now be explained in detail with reference to the drawings.

Figure 2:
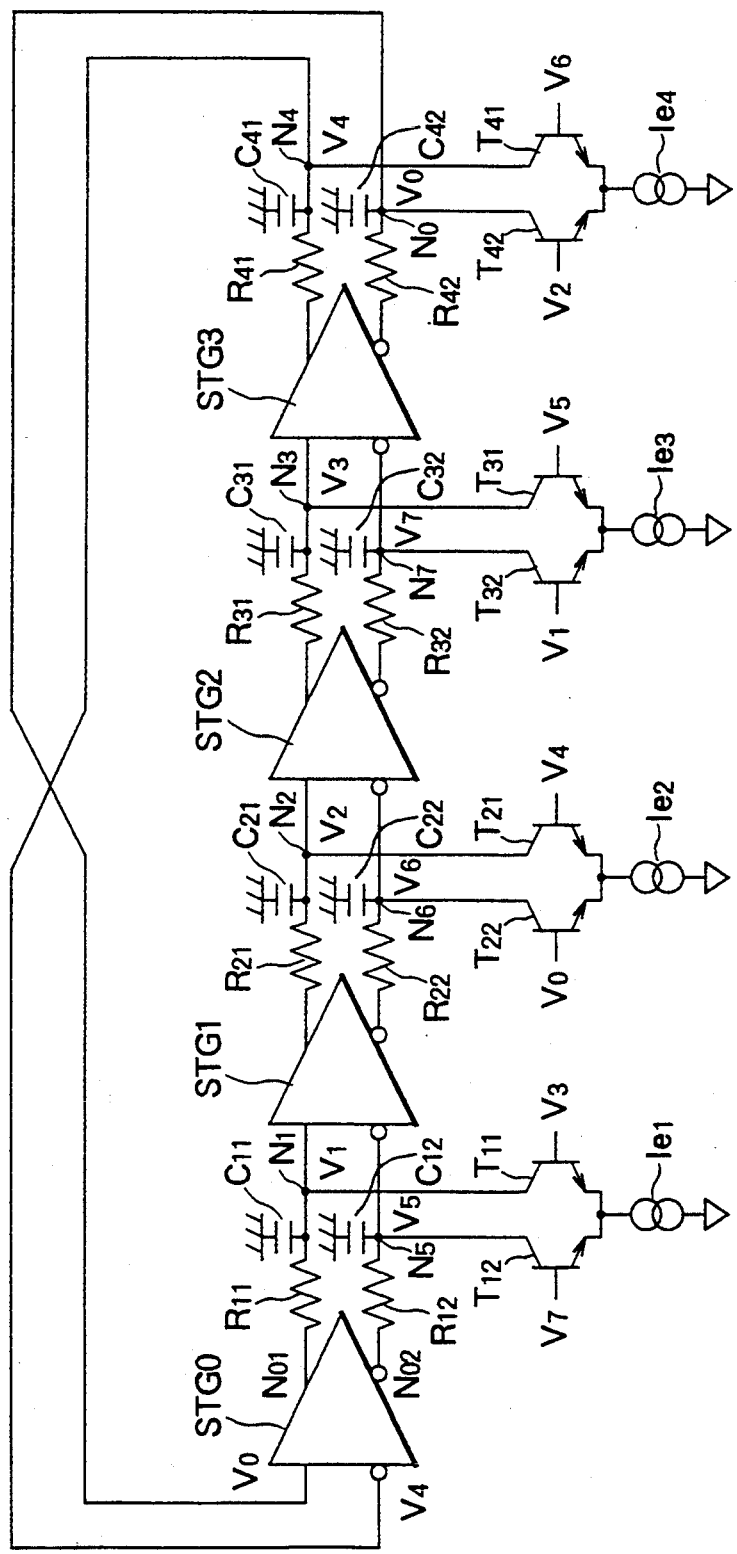
FIG. 2 is a circuit diagram of a first embodiment of the ring oscillator according to the present invention.

FIG. 2 is a circuit diagram of a first embodiment of the ring oscillator according to the present invention. In FIG. 2, STG0 to STG3 show differential type gain-stages, $R_{11}$, $R_{12}$, $R_{21}$, $R_{22}$, $R_{31}$, $R_{32}$, $R_{41}$, and $R_{42}$ show resistance elements, $C_{11}$, $C_{12}$, $C_{21}$, $C_{22}$, $C_{31}$, $C_{32}$, $C_{41}$, and $C_{42}$ show capacitors, $T_{11}$, $T_{12}$, $T_{21}$, $T_{22}$, $T_{31}$, $T_{32}$, $T_{41}$, and $T_{42}$ show npn type transistors, and $I_{e1}$ to $I_{e4}$ show constant current sources. These elements are connected as follows.

The positive (non-inverted) output terminal of the gain-stage STG0 and the positive input terminal of the gain-stage STG1 are connected through the resistance element $R_{11}$, and the negative (inverted) output terminal of the gain-stage STG0 and the negative input terminal of the gain-stage STG1 are connected through the resistance element $R_{12}$.

The capacitor $C_{11}$ is connected between a node $N_1$ which is the positive input terminal of the gain-stage STG1 and the ground, while the positive input terminal of the gain-stage STG1 is connected to a collector of the transistor $T_{11}$. The emitter of the transistor $T_{11}$ is connected to the constant current source $I_{e1}$, and the base is connected to a node $N_3$, which is the positive input terminal of the gain-stage STG3. An input voltage $V_3$ at the node $N_3$ connected to the positive input terminal of the gain-stage STG3 is applied to the base of the transistor $T_{11}$.

Further, the capacitor $C_{12}$ is connected between a node $N_5$, which is the negative input terminal of the gain-stage STG1 and the ground, and the negative input terminal of the gain-stage STG1 is connected to the collector of the transistor $T_{12}$. The emitter of the transistor $T_{12}$ is connected to the constant current source $I_{e1}$, the base is connected to a node $N_7$, which is the negative input terminal of the gain-stage STG3, and the input voltage $V_7$ at the node $N_7$ connected to the negative input terminal of the gain-stage STG3 is applied to the base of the transistor $T_{12}$.

The positive output terminal of the gain-stage STG1 and the positive input terminal of the gain-stage STG2 are connected through the resistance element $R_{21}$, while the negative output terminal of the gain-stage STG1 and the negative input terminal of the gain-stage STG2 are connected through the resistance element $R_{22}$.

The capacitor $C_{21}$ is connected between a node which is the positive input terminal of the gain-stage STG2 and the ground, and the positive input terminal of the gain-stage STG2 is connected to the collector of the transistor $T_{21}$. The emitter of the transistor $T_{21}$ is connected to a constant current source $I_{e2}$, the base is connected to a node $N_4$, which is the negative input terminal of the gain-stage STG0, and the input voltage $V_4$ at the node $N_4$ connected to the negative input terminal of the gain-stage STG0 is applied to the base of the transistor $T_{21}$.

The capacitor $C_{22}$ is connected between a node $N_6$, which is the negative input terminal of the gain-stage STG2 and the ground, and the negative input terminal of the gain-stage STG2 is connected to the collector of the transistor $T_{22}$. The emitter of the transistor $T_{22}$ is connected to the constant current source $I_{e2}$, the base thereof is connected to a node $N_0$, which is the positive input terminal of the gain-stage STG0, and the input voltage $V_0$ at the node $N_0$ connected to the positive input terminal of the gain-stage STG0 is applied to the base of the transistor $T_{22}$.

The positive output terminal of the gain-stage STG2 and the positive input terminal of the gain-stage STG3 are connected through the resistance element $R_{31}$, while the negative output terminal of the gain-stage STG2 and the negative input terminal of the gain-stage STG3 are connected through the resistance element $R_{32}$.

The capacitor $C_{31}$ is connected between the node $N_3$, which is the positive input terminal of the gain-stage STG3 and the ground, and the positive input terminal of the gain-stage STG3 is connected to the collector of the transistor $T_{31}$. The emitter of the transistor $T_{31}$ is connected to a constant current source $I_{e3}$, the base is connected to the node $N_5$, which is the negative input terminal of the gain-stage STG1, and the input voltage $V_5$ at the node $N_5$ connected to the negative input terminal of the gain-stage STG1 is applied to the base of the transistor $T_{31}$.

The capacitor $C_{32}$ is connected between the node $N_7$, which is the negative input terminal of the gain-stage STG3 and the ground, and the negative input terminal of the gain-stage STG3 is connected to the collector of the transistor $T_{32}$. The emitter of the transistor $T_{32}$ is connected to the constant current source $I_{e3}$, the base is connected to the node $N_1$, which is the positive input terminal of the gain-stage STG1, and the input voltage $V_1$ at the node $N_1$ connected to the positive input terminal of the gain-stage STG1 is applied to the base of the transistor $T_{32}$.

The positive output terminal of the gain-stage STG3 and the negative input terminal of the gain-stage STG0 are connected through the resistance element $R_{41}$, while the negative output terminal of the gain-stage STG3 and the positive input terminal of the gain-stage STG0 are connected through the resistance element $R_{42}$.

The capacitor $C_{41}$ is connected between the node $N_4$, which is the negative input terminal of the gain-stage STG0 and the ground, and the negative input terminal of the gain-stage STG0 is connected to the collector of the transistor $T_{41}$. The emitter of the transistor $T_{41}$ is connected to the constant current source $I_{e4}$, the base is connected to the node $N_6$, which is the negative input terminal of the gain-stage STG2, and the input voltage $V_6$ at the node $N_6$ connected to the negative input terminal of the gain-stage STG2 is applied to the base of the transistor $T_{41}$.

The capacitor $C_{42}$ is connected between the node $N_0$, which is the positive input terminal of the gain-stage STG0 and the ground, and the positive input terminal of the gain-stage STG0 is connected to the collector of the transistor $T_{42}$. The emitter of the transistor $T_{42}$ is connected to the constant current source $I_{e4}$, the base is connected to the node $N_2$, which is the positive input terminal of the gain-stage STG2, and the input voltage $V_2$ at the node $N_2$ connected to the positive input terminal of the gain-stage STG2 is applied to the base of the transistor $T_{42}$.

In this embodiment, a ring oscillator is comprised of a plurality of gain-stages connected by a plurality of low pass filters, each comprising the resistance element R and capacitor C connected in series. The ring oscillator is further provided with transconductance circuits, each consisting of a transistor in parallel to the capacitor of the low pass filter, and a constant current source, to thereby constitute a bandpass filter.

The ring oscillator is constituted by inserting pairs of the above bandpass filters between adjacent gain-stages connected in a ring.

In other words, two bandpass filters are provided between adjacent gain-stages, for example, STG0 and STG1. A first bandpass filter includes a first lowpass filter consisting of the resistance element $R_{11}$ and the capacitor $C_{11}$ and a first transconductance circuit consisting of the first npn-type transistor $T_{11}$ and the constant current source $Ie_1$. A second bandpass filter includes a second lowpass filter consisting of the resistance element $R_{12}$ and the capacitor $C_{12}$ and a second transconductance circuit consisting of the second npn-type transistor $T_{12}$ and the constant current source $I_{e1}$. The constant current source $I_{e1}$ is commonly used for the two transconductance circuits.

Figure 3:
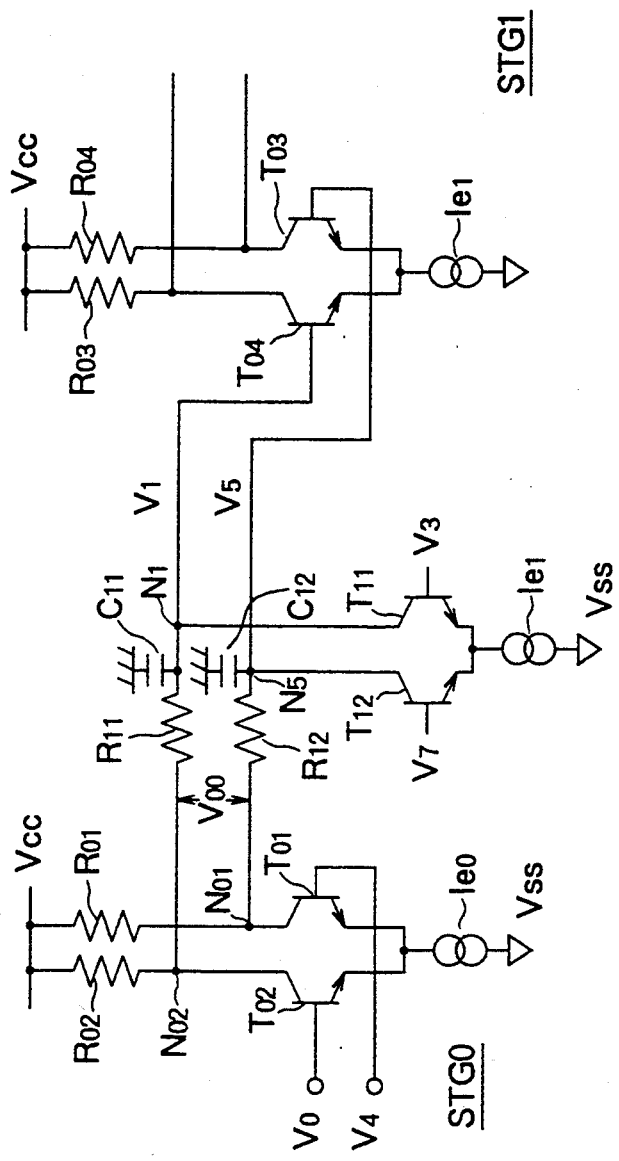
FIG. 3 is a partial and specific circuit diagram of the ring oscillator in FIG. 2.

FIG. 3 is a partial and specific circuit diagram of the ring oscillator shown in FIG. 2. The differential type gain-stage STG0 includes an emitter-coupled-logic (ECL) differential type amplifier circuit consisting of a pair of npn-type transistors $T_{01}$ and $T_{02}$ and load resistance elements $R_{01}$ and $R_{02}$ and a current source $I_{e0}$. Other gain-stages STG1 to STG3 have a similar circuit configuration. The differential type gain-stage STG0 receives input voltages $V_0$ and $V_4$, amplifies a differential voltage ($V_0-V_4$) and outputs an amplified voltage $V_{00}$ between nodes $N_{01}$ and $N_{02}$. The amplified voltage $V_{00}$ is set to compensate for a voltage drop at the bandpass filter and drive the next differential type gain-stage STG1.

Next, an explanation will be made, using FIG. 4, of the principle of the bandpass filter.

Figure 1:
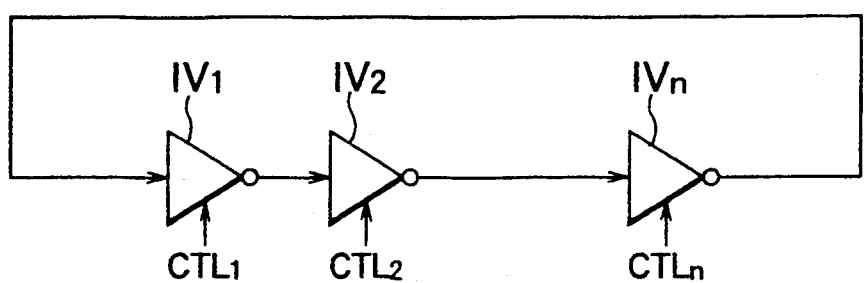
FIG. 1 is a view of an example of the configuration of a ring oscillator of the related art.
Figure 4:
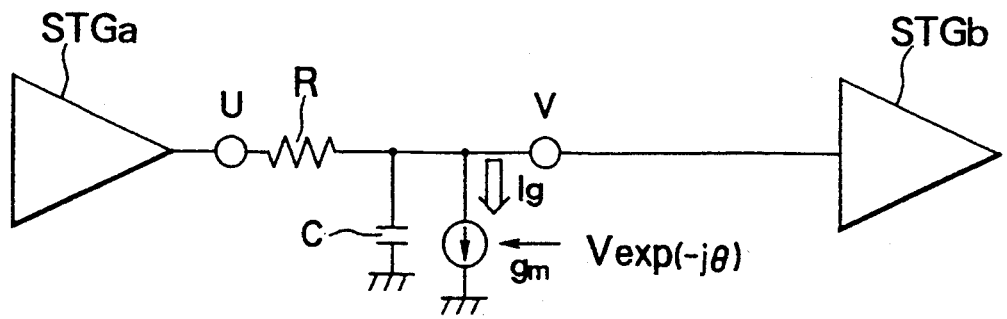
FIG. 4 is a view for explaining the principle of a bandpass filter according to the present invention.

In FIG. 4, STGa and STGb are gain-stages, U is the output voltage of the gain-stage STGa, and V is the input voltage of the next gain-stage STGb. The output terminal of the gain-stage STGa and the input terminal of the gain-stage STGb are connected through a resistance element R, and a capacitor C and a transconductance circuit are connected in parallel between the input terminal of the gain-stage STGb and the ground (reference potential).

The transconductance circuit is a circuit which passes a current Ig as shown in the following equation and proportional to $V.\exp(-j\theta)$ delayed by $\theta$ in phase from the terminal voltage V from the input terminal:

$$Ig = g_m \cdot V.\exp(-j\theta) \quad (1)$$

where, $g_m$ is a mutual conductance of the transistor in the transconductance circuit.

$V.\exp(-j\theta)$ can be obtained from the input of another gain-stage in the ring oscillator.

In the circuit of FIG. 2 as well, as mentioned earlier, the input voltage at the two following (subsequent) gain-stage is applied to the base of the transistor, the base serving as the trans-impedance constituting the voltage input terminal of the transconductance circuit.

The voltage difference between the output voltage U of the gain-stage STGa and the input voltage V of the gain-stage STGb is proportional to the sum of the current Ig and the current Ic flowing through the capacitor C, so the following equation stands:

$$U - V = R(Ig + Ic) = R(g_m \cdot V \exp(-j\theta) + Vj\omega C) \quad (2)$$

Therefore, $$U = (1 + R \cdot g_m \cdot \exp(-j\theta) + j\omega CR)V = \{1 + R \cdot g_m \cos\theta + j(\omega CR - R \cdot g_m \sin\theta)\}V \quad (3)$$

In equation (3), if $Rg_m = K$ and $CR = 1/\omega_0$, then the transfer function H of the bandpass filter is given by the following equation:

$$H = \frac{V}{U} = \frac{1}{1 + K\cos\theta + j\left(\dfrac{\omega}{\omega_0} - K\sin\theta\right)} \quad (4)$$

Figure 5:
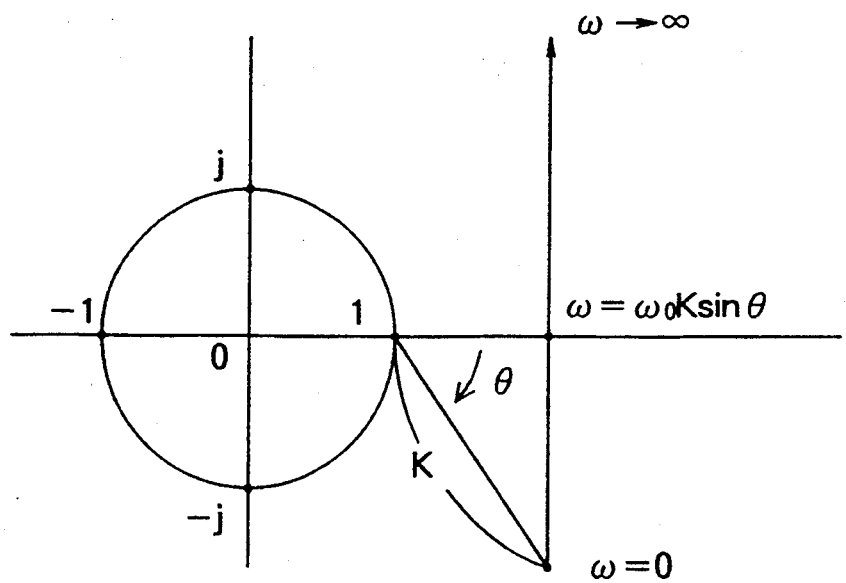
FIG. 5 is a view of the locus of inverse numbers of a transfer function of the filter of FIG. 4.

FIG. 5 is a graph of the locus of inverse numbers of the transfer function H: 1/H, in a complex plane, where an abscissa represents a real part and an ordinate represents an imaginary part (frequency domain). As shown in FIG. 5, the frequency $\omega_{min}$ giving the minimum absolute value of the inverse number of the function H:1/H is given by the following equation:

$$\omega_{min} = \omega_0 K \sin\theta = \frac{g_m}{C} \sin\theta \quad (5)$$

It is understood that the transfer function H shows a bandpass filter having a peak at the frequency $\omega_{min}$ given by equation (5).

Next, consider the circuit of FIG. 2 based on the above principle.

Figure 6:
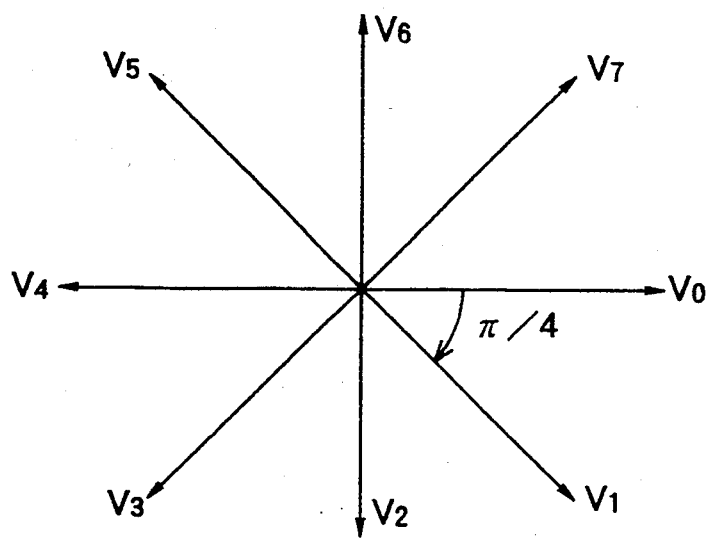
FIG. 6 is a view of the phase relationship of the input voltages of gates of the ring oscillator of FIG. 2.

FIG. 6 is a graph showing the phase relationship of the input voltages $V_0$ to $V_7$ at the nodes $N_0$ to $N_7$. The voltage $V_2$ is retarded by 45 degrees ($\pi/4$ rad) from the voltage $V_1$, and the voltage $V_3$ is retarded by 45 degrees from the voltage $V_2$, therefore, the voltage $V_3$ is retarded by 90 degrees ($\pi/2$ rad) from the voltage $V_1$. The base of the transistor $T_{11}$ is applied to the voltage $V_3$ retarded 90 degrees from the voltage $V_1$ applied to the collector thereof. Namely, there is a phase difference between the collector voltage and the base voltage of 90 degrees. Similarly, the base of the transistor $T_{12}$ is applied to the voltage $V_7$ retarded by 90 degrees from the voltage $V_5$ applied to the collector thereof.

Between adjacent gain-stages, for example, between the gain-stages STG0 to STG1, two bandpass filters, each including the transistor functioning as also a gate, are provided. Namely, between adjacent gain-stages, two gates are provided. In this example shown in FIG. 2, four gain-stages are provided, and hence, eight gates are provided. In other words, this circuit configuration is substantially equivalent to eight gate circuits.

In this embodiment provided with four gain-stages, i.e., an even number of gain-stages, the positive input terminal of the first gain-stage STG0 is connected to the negative output terminal of the fourth gain-stage STG3 through the node $N_0$, and the negative input terminal of the first gain-stage STG0 is connected to the positive output terminal of the fourth gain-stage STG3 through the node $N_4$. Namely, in this ring oscillator, polarities of the input voltages of the gain-stage are reversed.

Accordingly, in the circuit of FIG. 2, the bases of the transistors serving as the trans-impedances constituting the voltage input terminals of the transconductance circuits receive the input voltages of the second following (subsequent) gain-stage delayed by a phase difference of 90 degrees from the voltage at the collector.

The emitters of the pair of transistors, for example, the transistors $T_{11}$ and $T_{12}$, with the collectors connected at the differential inputs of the gain-stages are connected. A constant current source is connected to a point of connection of the two emitters. The pair of transistors $T_{11}$ and $T_{12}$ are given the voltages $V_3$ and $V_7$ having a reverse phase at the bases, so operate as trans-impedances having the conductances $g_m$ shown by the following equation:

$$g_m = \frac{I_0}{2V_{th}} \quad (6)$$

where, $I_0$ is the current of the respective constant current sources $I_{e1}$ to $I_{e4}$, and $V_{th}$ is the thermal voltage of the transistor.

The transfer function H1 of each the bandpass filters inserted between the gain-stages of the circuit of FIG. 2 is given by the following equation:

$$H = \frac{1}{1 + j\left(\frac{\omega}{\omega_0} - K\right)} \quad (7)$$

Figure 7:
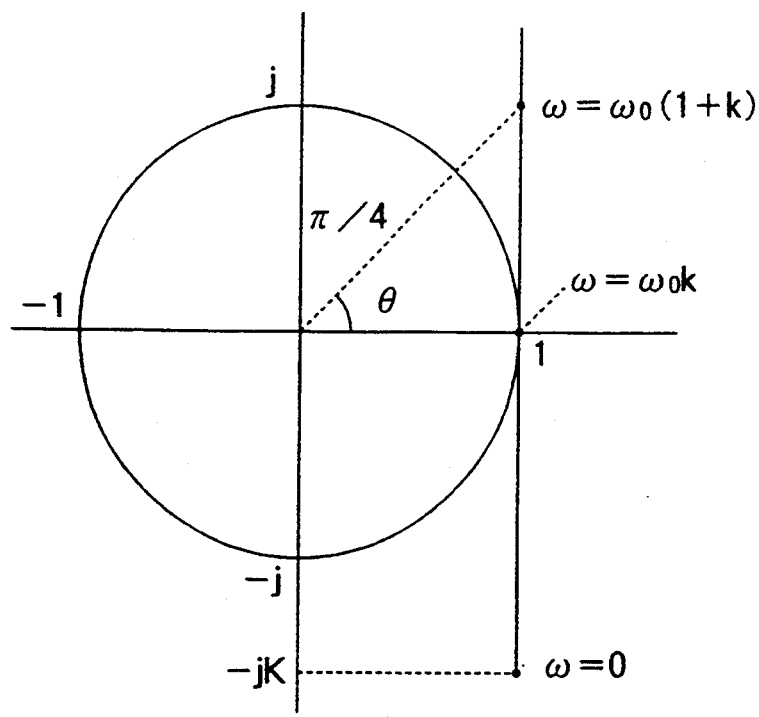
FIG. 7 is a view of the locus of inverse numbers of the transfer function of the bandpass filter in FIG. 2.

FIG. 7 is a graph of the locus of the denominator of equation (7). Equation (7) shows the transfer function of the bandpass filter having K as the Q value.

The bandpass filter has a phase delay $\Psi BPF$ shown by the following equation:

$$\Psi BPF = \tan^{-1}\left(\frac{\omega}{\omega_0} - K\right) \quad (8)$$

Further, the phase delay $\Psi STAGE$ of the gain-stage can be expressed as follows if the delay of the stage is t:

$$\Psi STAGE = 2\pi(t/T) = 2\pi fT = \omega t \quad (9)$$

where
T is a period
The frequency giving a sum of the two, i.e. $\Psi BPF$ and $\Psi STAGE$, of 45 degrees represents the oscillation frequency $\omega_{osc}$:

$$\omega_{osc} = \omega_0\{K + \tan(\pi/4 - \omega_{osc}t)\} \quad (10)$$

The oscillation frequency $\omega_{osc}$ represents the solution to equation (10). If K is a large value, the following equation stands:

$$\omega_{osc} \approx K\omega_0 \quad (11)$$

As explained above, according to this embodiment, a ring oscillator comprised of the gain-stages connected by the lowpass filters formed by the connecting the resistance elements R and the capacitors C in series is provided with the transconductance circuits comprised of the transistors parallel with the capacitors C of the low-pass filters. By passing currents proportional to signal voltages with phases differing by $\theta = 90$ degrees, the low pass filters and the transconductance circuits can operate as bandpass filters, as a result, the ring oscillator with a high, stable Q value can be obtained.

Further, each of the bandpass filters can be constituted by a single capacitor, for example $C_{11}$, and transistor, for example, $T_{11}$, which is suitable for an IC. Further, the construction is simple, and therefore, operation at a high frequency can be realized.

Also, by changing the center frequencies of the bandpass filters, it is possible to realize a voltage controlled oscillator (VCO) with a wide frequency range.

Figure 8:
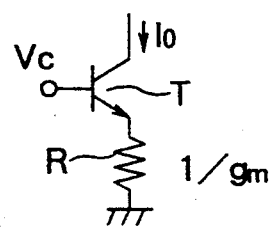
FIG. 8 is a view of the voltage control circuit for constituting a voltage controlled oscillator.

K is proportional to $g_m$, that is, K is proportional to the current $I_0$ from the above equation (6), so by controlling the current $I_0$ by the circuit shown in FIG. 8, it is possible to make the ring oscillator operate as a voltage controlled oscillator (VCO).

Figure 9:
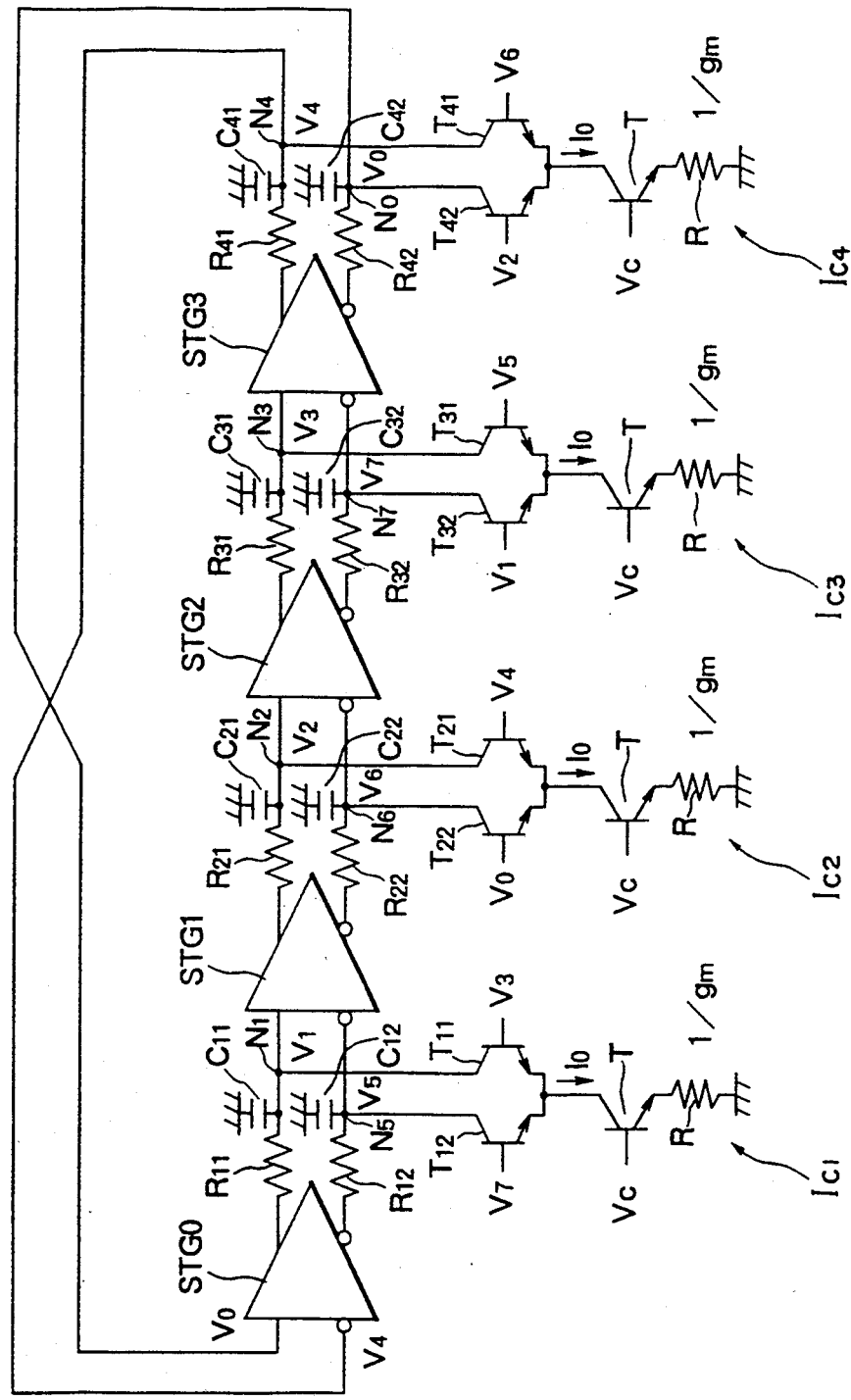
FIG. 9 is a circuit diagram of a voltage controlled oscillator.

FIG. 9 is a circuit diagram of the VCO. The VCO includes variable current sources $I_{c1}$ to $I_{c4}$, instead of the constant current sources $I_{e1}$ to $I_{e4}$ of the ring oscillator shown in FIG. 2. Each of the variable current sources $I_{c1}$ to $I_{c4}$ has a circuit construction shown in FIG. 8. Namely, the variable current source has a npn-transistor T and a resistance element R with characteristic expressed by $1/g_m$. The control voltage Vc is applied to the base and controls the input current $I_0$ passing through the transistor T. The VCO outputs a signal having a frequency approximately proportional to the control voltage Vc.

Figure 10:
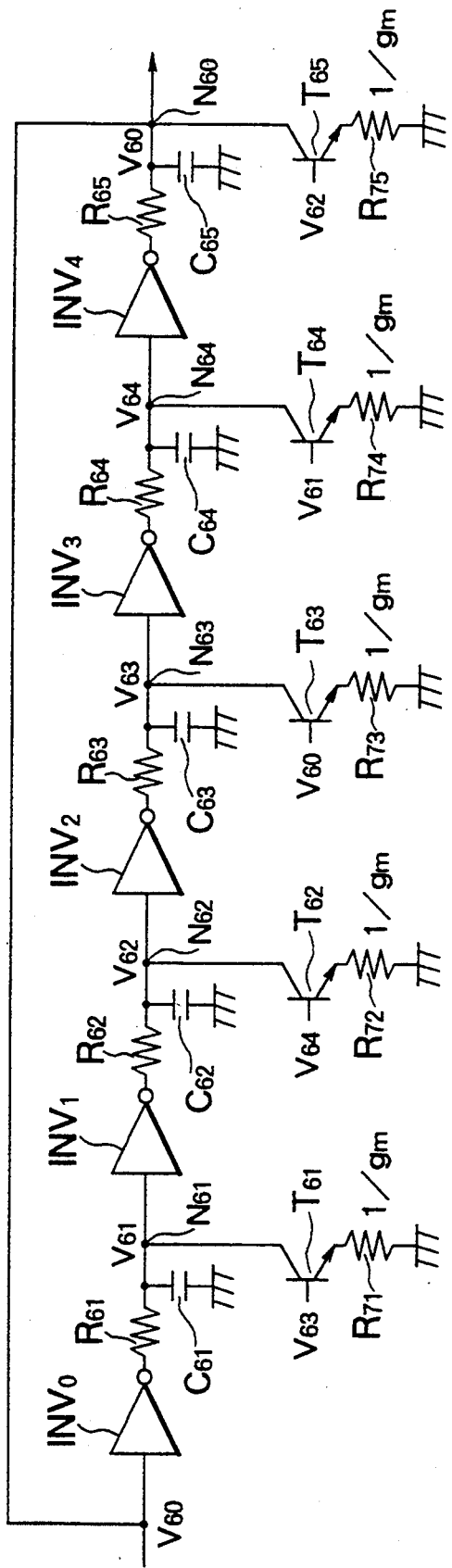
FIG. 10 is a circuit diagram of a second embodiment of the ring oscillator according to the present invention.

FIG. 10 is a circuit diagram of a second embodiment of the ring oscillator according to the present invention.

In this embodiment, five inverters $INV_0$ to $INV_4$ are used as gain-stages. The inverters $INV_0$ to $INV_4$ are connected by bandpass filters comprised of resistance elements R, for example, $R_{61}$, capacitors C, for example, $C_{61}$, and transistors T, for example, $T_{61}$, thereby constituting a ring oscillator.

Further, the trans-impedances are constituted by the transistors $T_{61}$ to $T_{65}$ and the emitter resistances ($1/g_m$) thereof.

Figure 11:
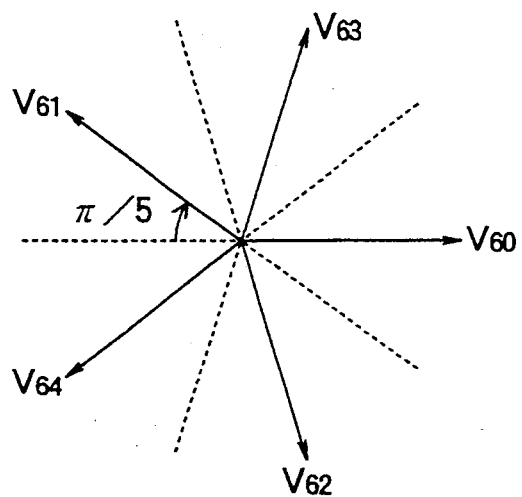
FIG. 11 is a view of the phase relationship of the input voltages of the gates of the ring oscillator of FIG. 10.

FIG. 11 is a graph of the phase relationship of the input voltages $V_0$ to $V_4$ of the inverters $INV_0$ to $INV_4$.

Figure 12:
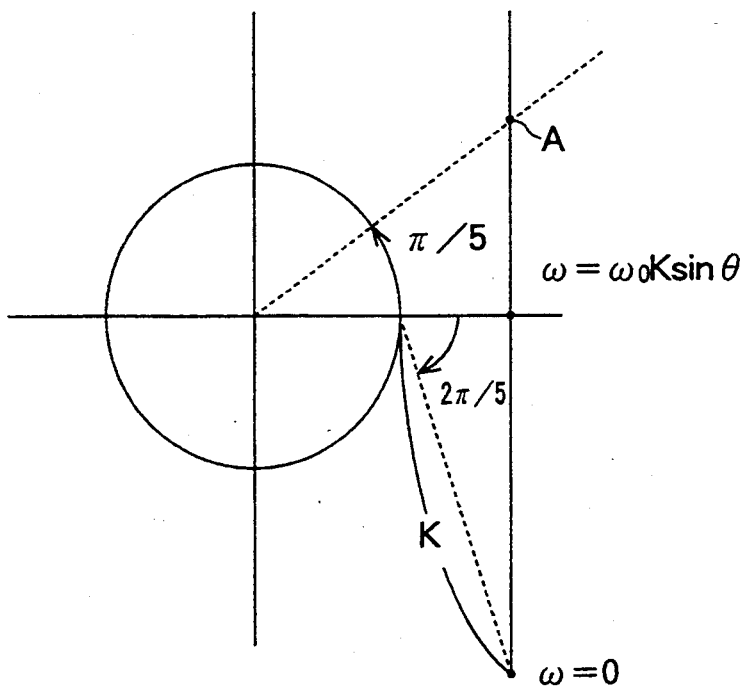
FIG. 12 is a view of the locus of inverse numbers of the transfer function of the bandpass filter in FIG. 10.

In this example, the phase $\theta$ of the above equation (4) is made $2\pi/5$. FIG. 12 is a graph of the locus of inverse numbers of the transfer function of the bandpass filters shown in FIG. 10.

In this ring oscillator, when the inverter delay can be ignored, the point A in the locus of FIG. 12 becomes the oscillation frequency.

Even in such a ring oscillator of five gain-stages, a similar effect to the first embodiment can be obtained.

Note that in the above-mentioned embodiments, the explanation was made of four and five gain-stages, but the invention is not of course limited to such numbers of stages.

As explained above, according to the present invention, bandpass filters are incorporated in the ring oscillator, and therefore, oscillation with a high, stable Q value is obtained.

Further, this is suitable for IC's and is simple in construction, and therefore operation at a high frequency is possible.

In addition, by changing the center frequencies of the bandpass filters, it is possible to realize a voltage controlled oscillator with a wide frequency range.

What is claimed is:

1. A ring oscillator circuit apparatus comprising:
a plurality of gain-stages connected in a ring via resistance elements;
capacitive elements connected between the inputs of the gain-stages and a reference potential; and
transconductance circuits connected between the inputs of said gain-stages and said reference potential.

2. A ring oscillator circuit apparatus according to claim 1, wherein said transconductance circuit passes a current with a fixed phase different from the input of said gain-stage from the input to said reference potential.

3. A ring oscillator circuit apparatus according to claim 2, wherein a voltage input terminal of said transconductance circuit of one gain-stage receives voltages from the input voltage of another gain-stage in the ring, said input voltage of said transconductance circuit of said another gain-stage and the output voltage of said one gain-stage having said fixed phase difference.

4. A ring oscillator circuit apparatus according to claim 3, wherein the center frequencies of bandpass filters including the resistance elements, capacitive elements, and transconductance circuits are changed by controlling the currents passing through said transconductance circuits.

5. A ring oscillator circuit apparatus comprising:

a plurality of gain-stages which are connected to be formed as a ring and a plurality of bandpass filters each of which is connected between one gain-stage and a next gain-stage and having a predetermined bandpass filtering characteristic.

6. A ring oscillator circuit apparatus according to claim 5, wherein each of said bandpass filters comprises a lowpass filter including a resistance element and a capacitive element, said resistance element being connected between said one and next gain-stages, and said capacitive element being connected between a node where said resistance element and said next gain-stage are connected and a reference potential, and a transconductance circuit including a transistor, connected between said node and said reference potential, and passing a current therethrough to said reference potential, said current having a phase difference from the voltage at said node and being defined by said voltage and said phase difference.

7. A ring oscillator circuit apparatus according to claim 6, wherein said transconductance circuit comprises a transistor and wherein said current is defined as follows:

$$g_m \cdot V \cdot \exp(-j\theta)$$

where, $g_m$ is a mutual conductance,

V is said voltage, and $\theta$ is said phase difference.

8. A ring oscillator circuit apparatus according to claim 6, wherein each of said gain-stages comprises an inverter, there being an odd number n of said inverters in total, and wherein an output of the last stage inverter is connected to an input of the first stage inverter through said resistance element in said bandpass filter.

9. A ring oscillator circuit apparatus according to claim 8, wherein said phase difference is $2\pi/n$ and wherein the output voltage of said bandpass filter at the second following stage is applied to a base of said transistor in said transconductance circuit.

10. A ring oscillator apparatus according to claim 9, wherein said transconductance circuit includes a constant current source and wherein an emitter of said transistor of said transconductance circuit is connected to said constant current source.

11. A ring oscillator apparatus according to claim 6, wherein said each of said gain-stages comprises a differential type gain-stage, there being an even number of said gain-stages in total, wherein two bandpass filters are provided in parallel between one gain-stage and a next gain-stage, a first bandpass filter comprising a first lowpass filter including a first resistance element, a first capacitive element, and a first transconductance circuit including a transistor and a second bandpass filter comprising a second lowpass filter including a second resistance element, a second capacitive element, and a second transconductance circuit including a transistor, and wherein a positive output terminal of the last gain-stage is connected to a negative input terminal of the first gain-stage through said first resistance element, and a negative output terminal of the last gain-stage is connected to a positive input terminal of the first gain-stage through said second resistance element.

12. A ring oscillator circuit apparatus according to claim 11, wherein said two transconductance circuits include a common constant current source and wherein emitters of said transistors of said transconductance circuits are connected to said common constant current source.

13. A voltage controlled circuit, according to claim 9, comprising said ring oscillator circuit apparatus and a plurality of variable current sources, each connected to emitters of said transistors of said transconductance circuit and including a transistor with a base to which is applied a control voltage.

14. A voltage controlled circuit, according to claim 11, comprising said ring oscillator circuit apparatus and a plurality of variable current sources, each connected to emitters of said transistors of said pair of transconductance circuits and including a transistor with a base to which is applied a control voltage.

* * * * *